United States Patent
Gambini et al.

(10) Patent No.: US 10,581,447 B1
(45) Date of Patent: Mar. 3, 2020

(54) METHOD AND APPARATUS FOR MEASURING PHASE RESPONSE

(71) Applicant: Apple Inc., Cupertino, CA (US)

(72) Inventors: Simone Gambini, San Francisco, CA (US); Robert G. Lorenz, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/147,531

(22) Filed: Sep. 28, 2018

(51) Int. Cl.
| H03M 1/10 | (2006.01) |
| H04L 7/02 | (2006.01) |
| G01R 27/28 | (2006.01) |
| H04B 17/20 | (2015.01) |
| H03M 1/66 | (2006.01) |
| G01R 31/28 | (2006.01) |

(52) U.S. Cl.
CPC .......... H03M 1/1071 (2013.01); G01R 27/28 (2013.01); G01R 31/2822 (2013.01); H03M 1/66 (2013.01); H04B 17/20 (2015.01); H04L 7/02 (2013.01)

(58) Field of Classification Search
CPC .. H03M 1/1071; H03M 1/1076; H03M 1/108; H03M 1/109; H03M 1/365; H03M 1/468; H03M 5/04; H03M 1/1061; H03M 1/12; H03M 1/804; H03M 1/0658; H03M 1/0695; H03M 1/1215; H03M 1/127; H03M 1/46; H03M 3/336; H03M 3/43; H03M 1/00
USPC .......................................... 341/110, 118–121
See application file for complete search history.

(56) References Cited

U.S. PATENT DOCUMENTS

| 4,335,373 | A | * | 6/1982 | Sloane | H03M 1/1071 341/120 |
| 5,063,383 | A | * | 11/1991 | Bobba | H03M 1/108 324/73.1 |
| 5,909,186 | A | * | 6/1999 | Gohringer | H03M 1/1071 341/120 |
| 6,326,909 | B1 | * | 12/2001 | Yamaguchi | H03M 1/1085 341/120 |
| 6,370,190 | B1 | * | 4/2002 | Young | H04L 25/03057 341/110 |
| 7,428,683 | B2 | | 9/2008 | Dai et al. | |
| 7,522,077 | B1 | * | 4/2009 | Itkin | H03M 1/1028 341/118 |
| 8,643,538 | B2 | | 2/2014 | Schantz et al. | |
| 8,798,207 | B2 | | 8/2014 | Wertz et al. | |

(Continued)

*Primary Examiner* — Linh V Nguyen
(74) *Attorney, Agent, or Firm* — Kowert, Hood, Munyon, Rankin & Goetzel, P.C.; Erik A. Heter

(57) ABSTRACT

A method and apparatus for measuring phase response in a radio receiver is disclosed. A radio receiver includes a digital-to-analog (D/A) conversion unit coupled to receive a test signal. The D/A conversion unit includes a number of single-bit digital-to-analog conversion (DAC) circuits coupled to receive the test signal and configured to convert it into the analog domain. Clock signals received by each of the single-bit DAC circuits are out of phase with respect to one another. The output of the D/A conversion unit is an analog signal that is a composite of the signals output by the DAC circuits therein. The analog signal is then conveyed to an analog-to-digital converter (ADC) and converted into an N-bit digital signal. The N-bit digital signal is then conveyed to a correlator to determine a phase response of the radio receiver.

18 Claims, 7 Drawing Sheets

(56) References Cited

U.S. PATENT DOCUMENTS

| | | | | |
|---|---|---|---|---|
| 8,890,731 | B2* | 11/2014 | Deng | H03M 1/109 |
| | | | | 341/120 |
| 2005/0219107 | A1* | 10/2005 | Guidry | H03M 1/1285 |
| | | | | 341/163 |
| 2008/0238741 | A1* | 10/2008 | Horisaki | H03M 1/108 |
| | | | | 341/120 |
| 2011/0074613 | A1* | 3/2011 | Newman | H03M 1/0665 |
| | | | | 341/143 |
| 2011/0075780 | A1* | 3/2011 | Petrovic | H03M 1/0614 |
| | | | | 375/355 |
| 2016/0020781 | A1* | 1/2016 | Baringer | H03M 3/46 |
| | | | | 341/110 |
| 2016/0094235 | A1* | 3/2016 | Kuttner | H03M 1/662 |
| 2016/0118996 | A1* | 4/2016 | Chen | H03M 1/66 |
| | | | | 341/118 |
| 2016/0182076 | A1* | 6/2016 | El-Chammas | H03M 1/1061 |
| | | | | 341/121 |
| 2018/0102779 | A1 | 4/2018 | Behel et al. | |

* cited by examiner

METHOD AND APPARATUS FOR MEASURING PHASE RESPONSE

BACKGROUND

Technical Field

This disclosure relates to wireless systems, and more particularly, to measuring phase response in wireless systems.

Description of the Related Art

In various types of radio receivers, frequency-dependent phase shifts can compromise a receiver's ability to be used in ranging applications. Furthermore, these phase shifts can be both temperature and process dependent. Accordingly, various methods have been developed to compensate for these phase shifts.

Compensation for frequency-dependent phase shifts includes testing and measurement of such phase shifts in order to determine the compensation requirements. Such measurement can include driving a radio frequency (RF) port of a radio receiver under test with a sinusoidal signal and performing a correlation operation.

SUMMARY

A method and apparatus for measuring phase response in a radio receiver is disclosed. In one embodiment, a radio receiver includes a digital-to-analog (D/A) conversion unit coupled to receive a test signal. The D/A conversion unit includes a number of single-bit digital-to-analog conversion (DAC) circuits coupled to receive the test signal and configured to convert it into the analog domain. Clock signals received by each of the single-bit DAC circuits are out of phase with respect to one another. The output of the D/A conversion unit is an analog signal that is a composite of the signals output by the DAC circuits therein. The analog signal is then conveyed to an analog-to-digital converter (ADC) and converted into an N-bit digital signal. The N-bit digital signal is then conveyed to a correlator to determine a phase response of a radio receiver.

In another embodiment, the apparatus can be extended for a radio receiver that uses quadrature amplitude modulation (QAM), with one signal path for the in-phase (I) component and one path for the quadrature (Q) component.

In one embodiment, the D/A conversion unit is a harmonic reject D/A converter. The harmonic reject D/A converter utilizes a number of single-bit DAC circuits, each of which receives the same single-bit test signal. However, the clock signals received by the single-bit DAC circuits vary in phase with respect to one another. For example, in an embodiment having three DAC circuits, the clock signal received by a second DAC circuit may be delayed by 45° relative to the clock signal received by a first DAC circuit, while the clock signal received by a third DAC circuit may be delayed by 45° relative to the clock signal received by the second DAC circuit. The analog signal output from the D/A conversion unit is a composite obtained by adding the output signals from each of the DAC circuits.

BRIEF DESCRIPTION OF THE DRAWINGS

The following detailed description makes reference to the accompanying drawings, which are now briefly described.

Figure 1:
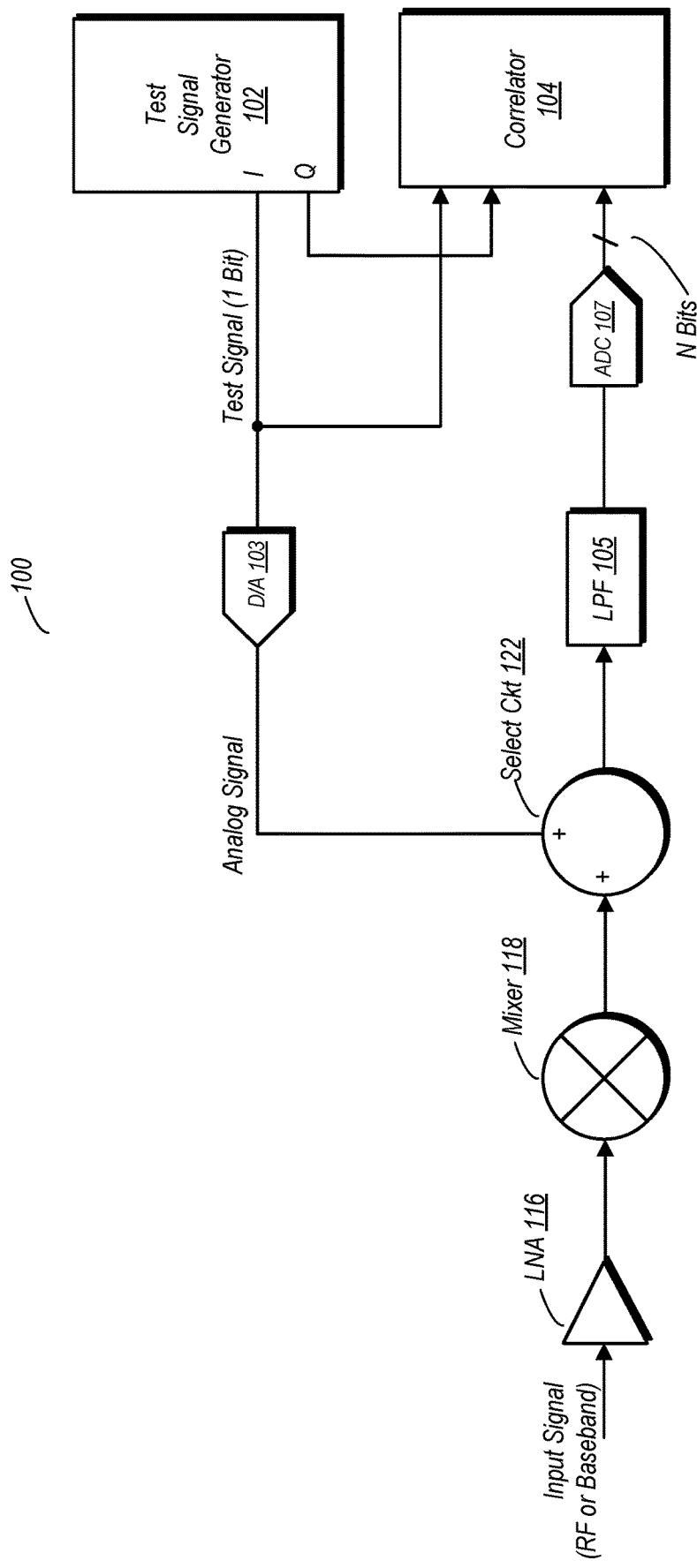
FIG. 1 is a block diagram of one portion of an embodiment of a radio receiver.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The various method and apparatus embodiments disclosed herein perform a determination of a phase response in a radio receiver. More particularly, the presence of frequency dependent phase shifts may be determined. Based on the determined phase shifts, compensation may be performed in the radio receiver.

In typical systems, testing for phase shift includes driving an RF port of a receiver with a test signal, which may be generated using external digital signal processing (DSP) hardware. After injecting the signal into the RF port, the signal may traverse a receiver path to a corresponding correlator. However, such systems are relatively complex, consume a significant amount of power, require high resolution DAC circuitry, and a high bit count correlator. In contrast, the various method and apparatus embodiments disclosed herein utilize a single-bit test signal (i.e., a digital stream one bit wide), relatively simple single-bit DAC circuits, and correlators able to perform correlation operations using single-bit signal. Additionally, the various method and apparatus embodiments disclosed herein may utilize on-chip test signal generation, obviating any need to drive an RF port with a test signal. Accordingly, the disclosure provides a solution that consumes less power and requires less complexity.

FIG. 1 is a block diagram of one portion of one embodiment of a radio receiver. In one embodiment, radio receiver 100 may be a pulse amplitude modulation (PAM) receiver, although the basic configuration may be extended to QAM receivers as discussed below in reference to FIG. 2. In the embodiment shown, radio receiver 100 includes an operational signal path having a port for an input signal (at RF or baseband frequency) to be input into a low noise amplifier (LNA) 116. The output of LNA is provided to mixer 118, where it is mixed with another periodic signal (the source of which is not shown for the sake of illustration). The signals are added to form a composite signal and fed to a low pass filter (LPF) 105. LPF 105 performs low pass filtering of the signal, after which it is conveyed to ADC 107. In ADC 107, the signal is converted into an N-bit digital signal, wherein N is an integer value of two or more. In typical implementations, N may equal values such as eight, sixteen, thirty-two, and so on. However, N may be any value that is suitable for a particular application. The N-bit digital signal is then received by correlator 104. The correlator performs a dot-product operation of the N-bit signal onto reference I and Q signals, determining the phasor angle of the N-bit signal in the I-Q plane and hence the phase shift of the receivers.

Radio receiver 100 in the embodiment shown also includes functional circuitry suitable for determining a phase response, or phase shift, in the operational signal path. Test signal generator 102 in the illustrated embodiment is configured to generate a 1-bit test signal, i.e. a stream of digital values one bit wide. The test signal is provided both to correlator 104, as well as D/A conversion unit 103. As will be discussed below in reference to FIG. 3, D/A conversion unit 103 in one embodiment is a harmonic reject D/A converter that includes separate instances of DAC circuitry. For example, one embodiment of D/A conversion unit 103 includes three different DAC circuits. Each of the DAC circuits within D/A conversion unit 103 is coupled to receive a respective clock signal. The respective clock signals vary in phase with respect to each other (e.g., a phase shift of 45° from one clock signal to the next). Accordingly, the output signals provided by each of the DAC circuits therein are phase shifted relative to each other. These signals are then summed into a composite analog signal, which is output from D/A conversion unit 103.

The analog signal output from D/A conversion unit 103 is conveyed to a select circuit 122, and then to LPF 105. In LPF 105, higher frequency components are attenuated, and a filtered version of the analog signal is forwarded to ADC 107. In ADC 107, the signal is converted back into the digital domain as a digital signal that is N bits wide (N being an integer value of two or more).

The N-bit digital signal is then received by correlator 104, where a correlation operation is performed relative to the 1-bit test signal output from test signal generator 102. Through the correlation operation, a phase shift of the signal traversing the operational signal path can be determined. This information can then be used during normal operation to compensate for the determined phase shifts. Although note explicitly shown here, additional compensation circuitry may be present, and may perform a compensation based on the determined phase shifts.

In one embodiment, correlator 104 is implemented using 1-bit multipliers, which can result in significant power savings relative to embodiments that use multi-bit multipliers and multi-bit test signals as generated by DSP circuitry.

In one embodiment, the various components of radio receiver 100 are implemented on the same integrated circuit (IC) die, including test signal generator. Accordingly, determination of phase shifts may be performed as desired without any need to connect any external equipment to an RF port of the receiver.

Figure 2:
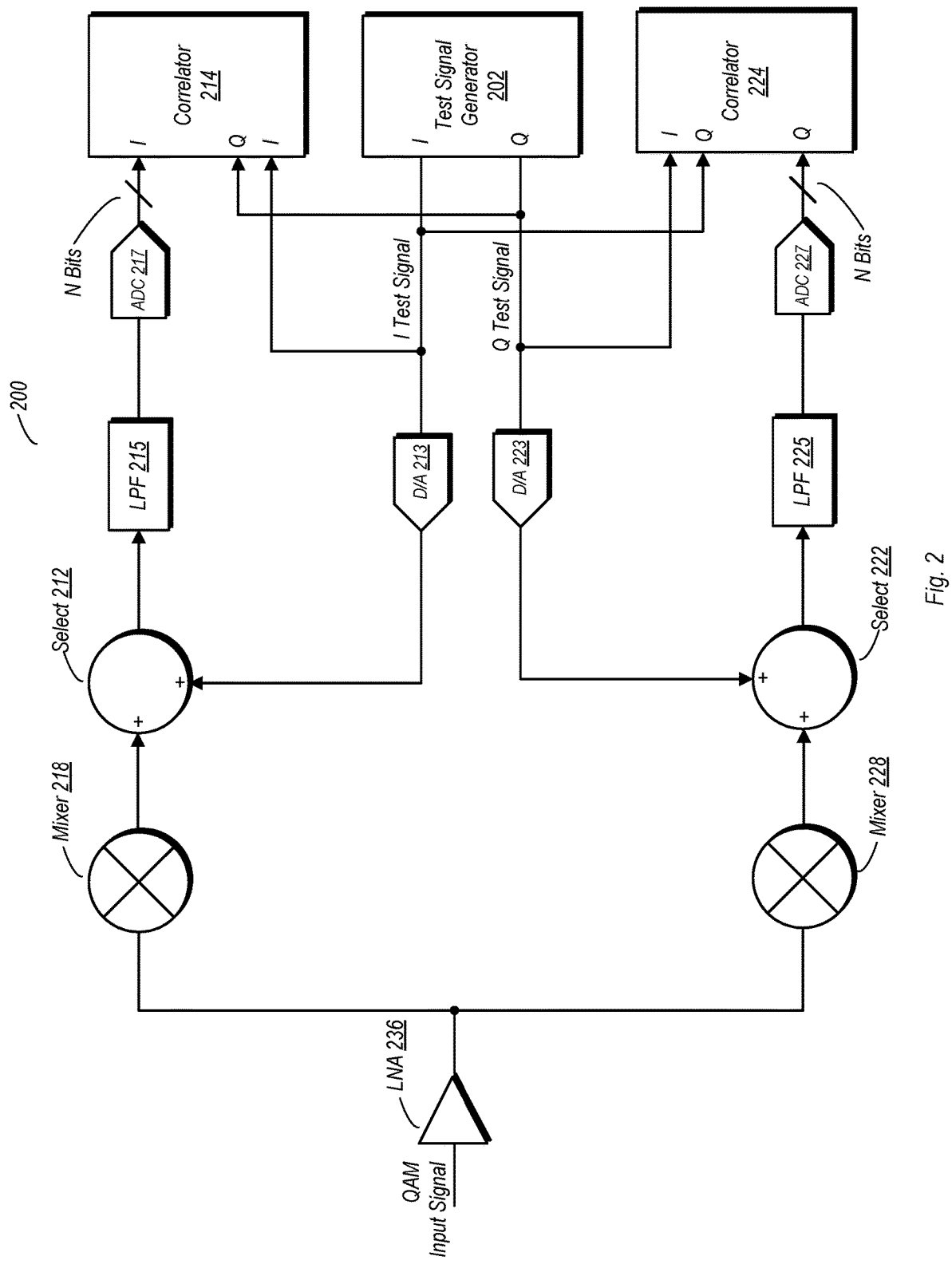
FIG. 2 is a block diagram of a portion of one embodiment of a QAM receiver.

FIG. 2 is a block diagram of a portion of one embodiment of a QAM receiver. Receiver 200 in the embodiment shown, in part, duplicates the configuration of receiver 100 of FIG. 1. In this embodiment, separate signal paths are provided for the in-phase (I) and quadrature (Q) components in a receiver that is configured to receiver QAM signals. Test signal generator 202 in the embodiment shown generates two test signals, one for the I component and one for the Q component of the quadrature signal. As with the embodiment of FIG. 1, both of these test signals are single-bit signals.

Correlator 214 in the embodiment shown determines the phase response of the I signal, while correlator 224 determines the phase response of the Q signal. Additionally, both correlators are coupled to receive both test signal components, I and Q. Thus, correlator 214 performs a correlation of the received N-bit digital signal corresponding to the I component, but also performs a correlation relative to the Q component in accordance with the Q test signal. Similarly, correlator 224 in the embodiment shown performs a correlation of the N-bit digital signal corresponding to the Q component with the Q test signal, but also performs a correlation relative to the I component in accordance with the I test signal.

Figure 3:
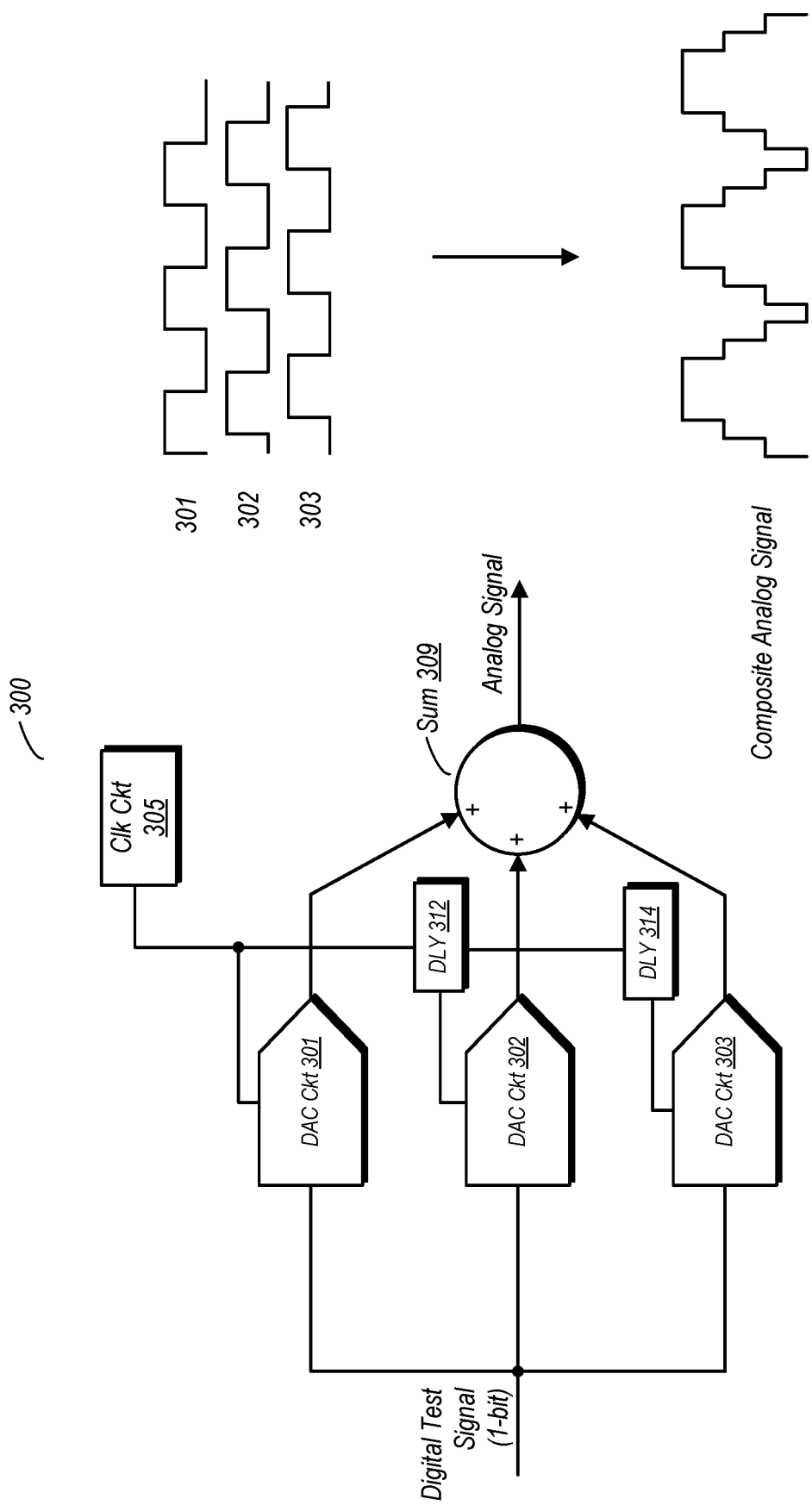
FIG. 3 is a block diagram of one embodiment of D/A conversion unit.

FIG. 3 is a block diagram of one embodiment of D/A conversion unit. In the embodiment shown, D/A conversion unit 300 is a harmonic rejection D/A converter, and may be utilized in the receiver embodiments discussed above in reference to FIGS. 1 and 2. In particular, D/A conversion unit 300 may be utilized in place of D/A conversion unit 103 of FIG. 1 as well as in place of D/A conversion units 213 and 223 of FIG. 2.

D/A conversion unit 300 includes three DAC circuits, DAC circuit 301, DAC circuit 302, and DAC circuit 303. Each of these DAC circuits is coupled to receive the same digital test signal as an input. Each of the DAC circuits is coupled to receive a corresponding clock signal, with the clock signals being out of phase with respect to one another. Clock circuit 305 is coupled to provide a clock signal directly to DAC circuit 301. DAC circuit 302 receives a clock signal via delay element 312, which provides a desired amount of phase delay to the clock signal. DAC circuit 303 receives its clock signal via both delay elements 312 and 314, the latter which provides an additional amount of delay over delay element 312. In one example embodiment, each of delay elements 312 and 314 may provide 45° of phase delay. Accordingly, the clock signal received by DAC circuit 302 is delayed by 45° relative to the clock signal receive by DAC circuit 301, while the clock signal received by DAC circuit 303 is delayed by 90° relative to the clock signal received by DAC circuit 301. However, the actual phase shifts between the clock signals may vary from one embodiment to another. Additionally, while the embodiment shown includes three DAC circuits, the actual number may also vary from one embodiment to another.

The analog signals output by each of DAC circuits 301, 302, and 303 are received by summing circuit 309. These signals are then summed to produce a composite analog output signal. In the upper right hand portion of the drawing, an example of the clock signals input into DAC circuits 301, 302, and 303 is shown, while a resulting composite analog signal is shown in the lower right hand portion. In practice, the shape of the signal may vary depending on the digital values of the digital test signal, and thus the shape of the composite analog signal shown here is an example provided for the sake of illustrations.

In the embodiment shown, the DAC circuits are arranged such that certain harmonics (e.g., third and fifth) of the analog signal frequency are removed. Other arrangements are possible and contemplated in which additional harmonics may also be removed. Removal of these harmonics may allow for a more accurate determination of the phase response of the receiver.

Figure 4:
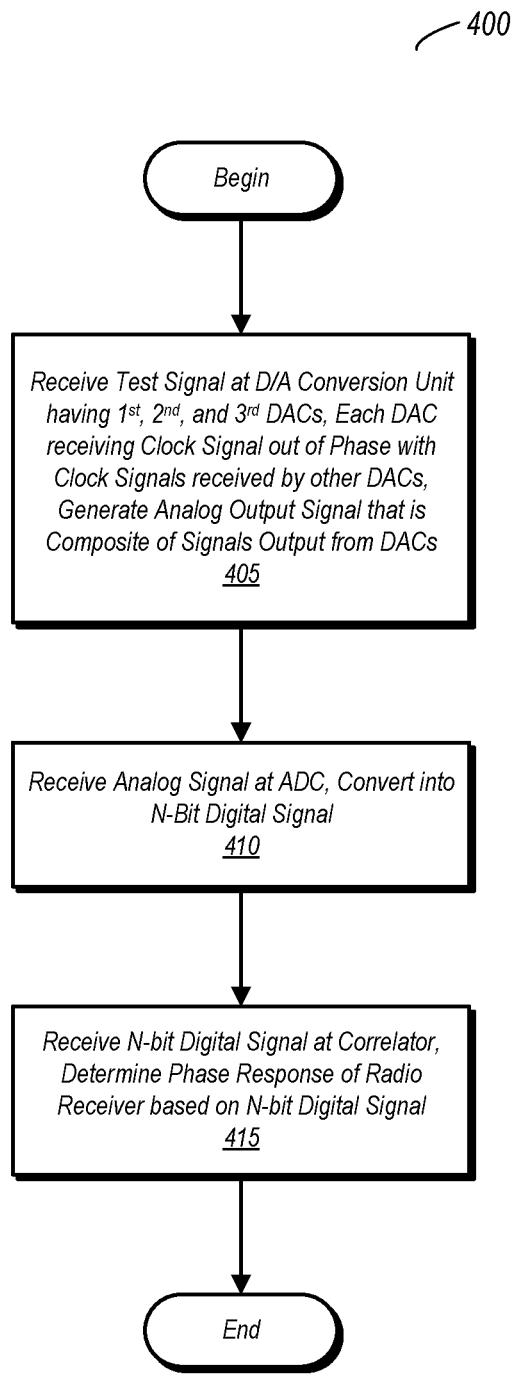
FIG. 4 is a flow diagram of one embodiment of a method for determining a phase response of a radio receiver.

FIG. 4 is a flow diagram of one embodiment of a method for determining a phase response of a radio receiver. Method 400 as discussed herein may be performed with various embodiments of the hardware discussed above in reference to FIGS. 1-3. Additionally, it is contemplated that other hardware embodiments not explicitly discussed herein may be capable of carrying out method 400, and thus such embodiments may fall within the scope of this disclosure.

Method 400 includes a first D/A conversion unit receiving a first test signal, the first D/A conversion unit having first, second, and third single-bit digital-to-analog converter (DAC) circuits each coupled to receive corresponding clock signals that are out of phase with respect to each other, and the first D/A conversion unit outputting a first analog signal that is a composite of output signals generated by the first, second and third DAC circuits (block 405). Method 400 further includes a first ADC circuit receiving the first analog signal and converting the analog signal into a first N-bit digital signal (block 410). Method 400 concludes with receiving the first N-bit digital signal at a first correlator, with the first correlator determining a first phase response of a radio receiver based on the first N-bit digital signal.

Method 400 as described above may be performed for a radio receiver having a single signal path, such as a PAM receiver (although test signals may include both I and Q signals). However, embodiments are also possible and contemplated wherein the method can be extended to a receiving arranged to receive QAM signals. Accordingly, in such embodiments, the first test signal is an in-phase test signal. Furthermore, test signal generator in such embodiments generates a second test signal, the second test signal being a quadrature phase test signal. Since there are separate signal paths for the in-phase and quadrature phase test signals, a QAM embodiment of the method further includes a second D/A conversion receiving the second test signal, the second D/A conversion unit having fourth, fifth, and sixth single-bit DAC circuits each coupled to receive corresponding clock signals that are out of phase with respect to each other, and the second D/A conversion unit outputting a second analog signal that is a composite of output signals generated by the fourth, fifth, and sixth DAC circuits. The QAM embodiments of the method further include a second ADC circuit receiving the second analog signal and converting the analog signal into a second N-bit digital signal and a second correlator determining a phase response of a quadrature phase response of the radio receiver based on the second N-bit digital signal.

Figure 5:
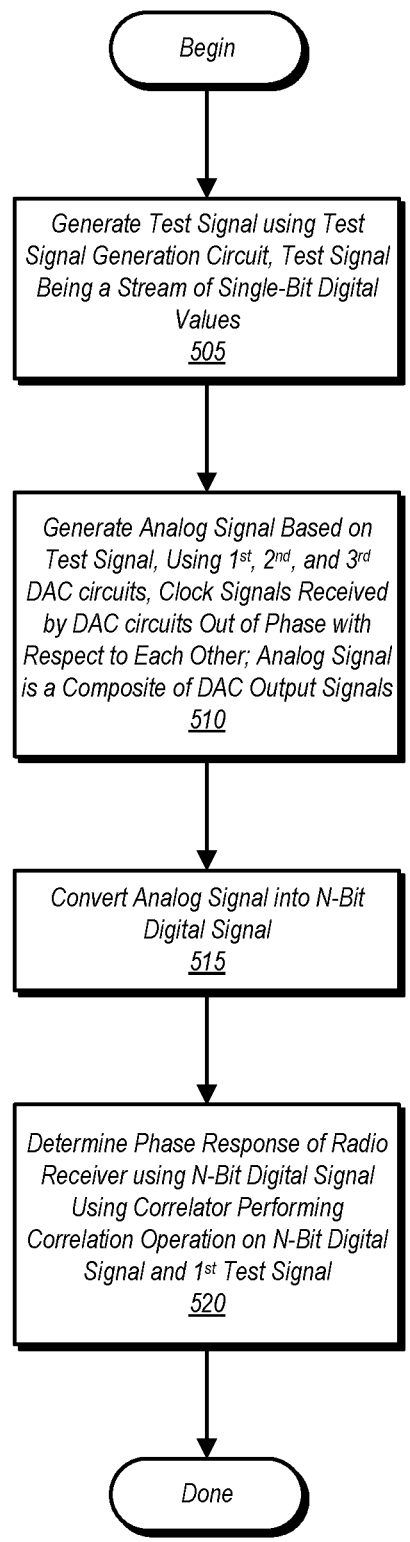
FIG. 5 is a flow diagram of another embodiment of a method for determining a phase response of a radio receiver.

FIG. 5 is a flow diagram of another embodiment of a method for determining a phase response of a radio receiver. As with method 400 discussed above, method 500 may also be performed with various embodiments of the hardware discussed above, as well as with certain hardware embodiments not explicitly discussed herein.

Method 500 includes generating a first test signal using a test signal generation circuit, the first test signal comprising a first stream of single-bit digital values (block 505). The method further includes generating a first analog signal based on the first test signal using first, second, and third single-bit digital-to-analog converter (DAC) circuits of a first digital-to-analog (D/A) conversion unit, wherein respective clock signals received by the first, second, and third single-bit DACs are out of phase with respect to each other, and wherein the first analog signal is a composite of output signals produced by the first, second, and third single-bit DACs (block 510). Thereafter, method 500 includes converting the first analog signal into a first N-bit digital signal (block 515). The method further includes determining a first phase response of a radio receiver using the first N-bit digital signal, wherein determining the phase response comprises a first correlator performing a correlation operation using the N-bit digital signal and the first test signal (block 520).

As with method 400, method 500 can be extended from a single path embodiment to cover QAM embodiments. In a QAM embodiment, the first test signal is an in-phase component of an IQ signal, and the method further includes the test signal generation circuit generating a second test signal, the second test signal being a quadrature component of the IQ signal. A QAM embodiment of the method further includes generating a second analog signal based on the second test signal using fourth, fifth, and sixth single-bit DAC circuits of a second D/A conversion unit. Respective clock signals received by the fourth, fifth, and sixth single-bit DACs are out of phase with respect to each other. The second analog signal is a composite of output signals produced by the fourth, fifth, and sixth single-bit DACs. The method further includes converting the second analog signal into a second N-bit digital signal and determining a second phase response of a radio receiver using the second N-bit digital signal. Determining the phase response comprises a second correlator performing a correlation operation using the N-bit digital signal and the first test signal.

Various embodiments of the QAM radio receivers include low-pass filters in the respective signal paths. Corresponding method embodiments thus include low-pass filtering the first analog signal and low-pass filtering the second analog signal. The original test signals are also used in the correlation process. Therefore, corresponding method embodiments include providing the first test signal to the first correlator and providing the second test signal to a second correlator.

Figure 6:
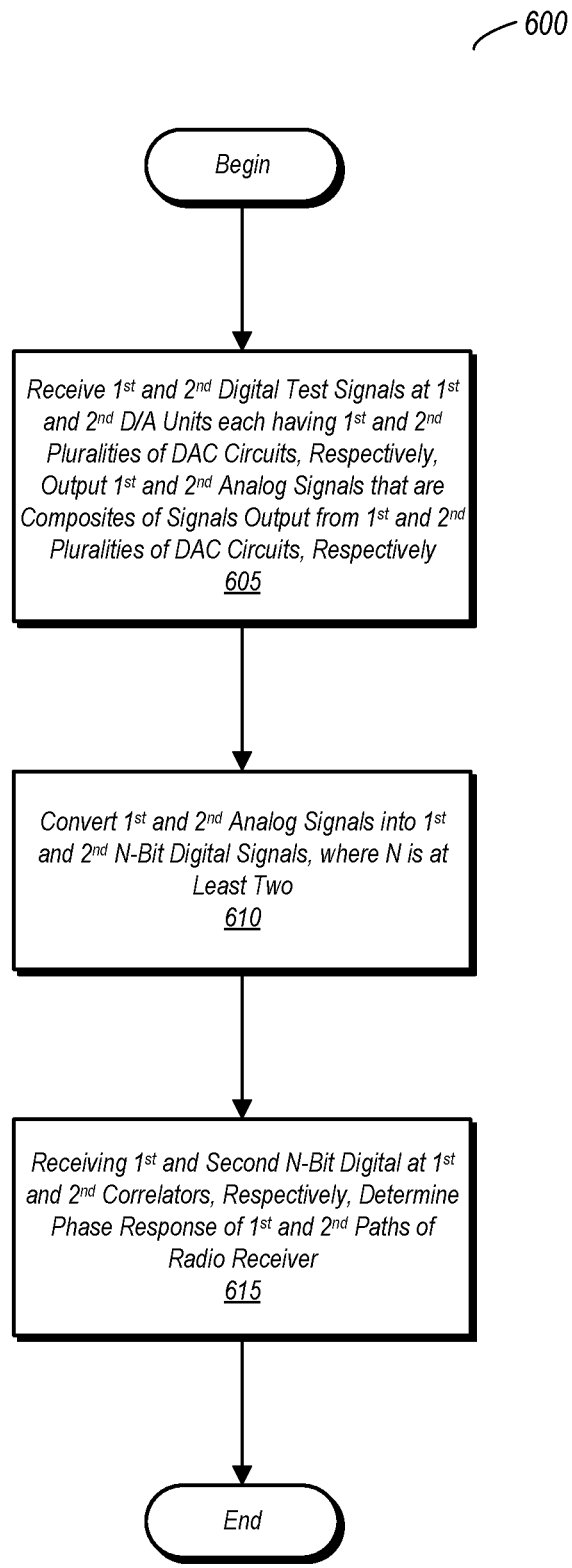
FIG. 6 is a flow diagram of another embodiment of a method for determining a phase response of a radio receiver.

FIG. 6 is a flow diagram of another embodiment of a method for determining a phase response of a radio receiver. Method 600 in the embodiment shown is suitable for use in radio receivers configured to receive QAM signals.

Method 600 includes first and second D/A conversion units receiving first and second digital test signals, respectively, the first and second D/A conversion units having first and second pluralities of single-bit DAC circuits, respectively, wherein the first D/A conversion unit is configured to output a first analog signal that is a composite of signals output from the first plurality of single-bit DAC circuits, and wherein the second D/A conversion unit is configured to output a second analog signal that is a composite of signals output from the second plurality of single-bit DAC circuits (block 605). The method further includes first and second ADC circuits converting the first and second analog signals into first and second N-bit digital signals, respectively, wherein N is an integer value of at least two (block 610). Method 600 concludes with first and second correlators receiving the first and second N-bit digital signals and determining phase responses of first and second signal paths of a radio receiver. Since the embodiment discussed with regard to FIG. 6 is a QAM embodiment, the first digital test signal corresponds to an in-phase (I) component of a QAM signal, and wherein the second digital test signal corresponds to a quadrature (Q) component of the QAM signal.

With regard to the D/A conversion units, the first plurality of DAC circuits includes first, second, and third DAC circuits, wherein a clock signal received by the first DAC circuit is delayed relative to a clock signal received by the second DAC circuit, and wherein a clock signal received by the second DAC circuit is delayed relative to a clock signal received by the third DAC circuit. The second plurality of DAC circuits includes fourth, fifth, and sixth DAC circuits, wherein a clock signal received by the fourth DAC circuit is delayed relative to a clock signal received by the fifth DAC circuit, and wherein a clock signal received by the fifth DAC circuit is delayed relative to a clock signal received by the sixth DAC circuit. The first correlator is coupled to receive the first digital test signal, while the second correlator is coupled to receive the second digital test signal. A test signal generator configured to generate the first and second digital test signals. The system includes a radio receiver integrated circuit (IC), wherein the test signal generator, the first and second correlators, and the first and second D/A conversion units are implemented on the radio receiver IC. Further implemented in the system is a first low-pass filter coupled to receive the first analog signal and configured to provide a filtered version of the first analog signal to the first ADC circuit, and a second low-pass filter coupled to receive the second analog signal and configured to provide a filtered version of the second analog signal to the second ADC circuit.

Figure 7:
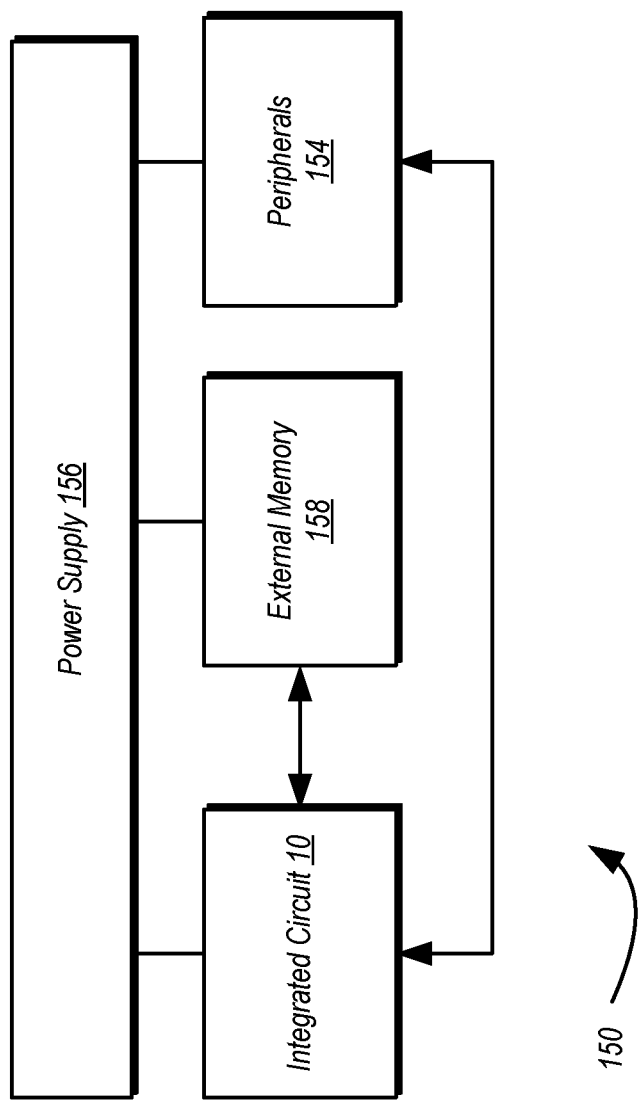
FIG. 7 is a block diagram of one embodiment of an example system.

Turning next to FIG. 7, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.). In some embodiments, integrated circuit 10 and/or peripherals 154 may include the various embodiments falling within the scope of disclosure for functional circuit blocks illustrated in FIGS. 1-3, and may be able to carry out various embodiments of the methods falling within the scope of those illustrated in FIGS. 4-6.

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a first digital-to-analog (D/A) conversion unit coupled to receive a first test signal comprising a first stream of single-bit digital values, the first D/A conversion unit having first, second, and third single-bit digital-to-analog converter (DAC) circuits, wherein each of the first, second, and third DAC circuits are each coupled to receive corresponding clock signals that are out of phase with respect to each other, wherein the first D/A conversion unit is configured to output a first analog signal that is a composite of output signals generated by the first, second and third DAC circuits;
   a first analog-to-digital converter (ADC) circuit coupled to receive the first analog signal and configured to convert the analog signal into a first N-bit digital signal; and
   a first correlator coupled to receive the N-bit digital signal and the test signal from a test signal generator and configured to determine a first phase response of a radio receiver based on the first N-bit digital signal and the test signal.

2. The apparatus as recited in claim 1, wherein the first D/A conversion unit, the first ADC circuit, and the first correlator are implemented on an integrated circuit, wherein the IC further includes a test signal generator configured to generate a first test signal.

3. The apparatus as recited in claim 2, wherein the first test signal is an in-phase test signal, wherein the test signal generator is further configured to generate a second test signal, the second test signal being a quadrature phase test signal.

4. The apparatus as recited in claim 3, further comprising:
   a second digital-to-analog (D/A) conversion unit coupled to receive the second test signal, the second D/A conversion unit having fourth, fifth, and sixth single-bit DAC circuits each coupled to receive corresponding clock signals that are out of phase with respect to each other, wherein the second D/A conversion unit is configured to output a second analog signal that is a composite of output signals generated by the fourth, fifth, and sixth DAC circuits.

5. The apparatus as recited in claim 4, further comprising a second analog-to-digital converter (ADC) circuit coupled to receive the second analog signal and configured to convert the analog signal into a second N-bit digital signal; and
   a second correlator configured to determine a phase response of a quadrature phase response of the radio receiver based on the second N-bit digital signal.

6. The apparatus as recited in claim 1, further comprising a low-pass filter coupled between an output of the first D/A conversion unit and an input of the first ADC.

7. A method comprising:
   generating a first test signal using a test signal generation circuit, the first test signal comprising a first stream of single-bit digital values;
   generating a first analog signal based on the first test signal using first, second, and third single-bit digital-to-analog converter (DAC) circuits of a first digital-to-analog (D/A) conversion unit, wherein respective clock signals received by the first, second, and third single-bit DACs are out of phase with respect to each other, and wherein the first analog signal is a composite of output signals produced by the first, second, and third single-bit DACs;
   converting the first analog signal into a first N-bit digital signal; and
   determining, using a correlator, a first phase response of a radio receiver using the first N-bit digital signal and the test signal, wherein determining the phase response comprises a first correlator performing a correlation operation using the N-bit digital signal and the first test signal.

8. The method as recited in claim 7, wherein the first test signal is an in-phase component of an IQ signal, and wherein the method further comprises the test signal generation circuit generating a second test signal, the second test signal being a quadrature component of the IQ signal.

9. The method as recited in claim 8, further comprising:
   generating a second analog signal based on the second test signal using fourth, fifth, and sixth single-bit DAC circuits of a second D/A conversion unit, wherein respective clock signals received by the fourth, fifth, and sixth single-bit DACs are out of phase with respect to each other, and wherein the second analog signal is a composite of output signals produced by the fourth, fifth, and sixth single-bit DACs.

10. The method as recited in claim 9, further comprising:
    converting the second analog signal into a second N-bit digital signal; and
    determining a second phase response of a radio receiver using the second N-bit digital signal, wherein determining the phase response comprises a second correlator performing a correlation operation using the N-bit digital signal and the first test signal.

11. The method as recited in claim 9, further comprising:
    low-pass filtering the first analog signal; and
    low-pass filtering the second analog signal.

12. The method as recited in claim 8, further comprising:
    providing the first test signal to the first correlator; and
    providing the second test signal to a second correlator.

13. A system comprising:
    first and second digital-to-analog (D/A) conversion units coupled to receive first and second digital test signals, the first and second digital test signal each comprising a stream of single-bit digital values, respectively, the first and second D/A conversion units having first and second pluralities of single-bit digital-to-analog converter (DAC) circuits, respectively, wherein the first D/A conversion unit is configured to output a first analog signal that is a composite of signals output from the first plurality of single-bit DAC circuits, and wherein the second D/A conversion unit is configured to output a second analog signal that is a composite of signals output from the second plurality of single-bit DAC circuits;

first and second analog-to-digital converter (ADC) circuits configured to convert the first and second analog signals into first and second N-bit digital signals, respectively, wherein N is an integer value of at least two; and first and second correlators coupled to, respectively, receive the first and second N-bit digital signals and further coupled to respectively receive the first and second digital test signals and configured to respectively determine phase responses of first and second signal paths of a radio receiver, wherein the first correlator is configured to determine the phase response of the first signal path based on the first N-bit digital signal and the first digital test signal, and wherein the second correlator is configured to determine the phase response of the second signal path based on the second N-bit digital signal and the second digital test signal.

14. The system as recited in claim 13, wherein the first digital test signal corresponds to an in-phase (I) component of a quadrature amplitude modulated (QAM) signal, and wherein the second digital test signal corresponds to a quadrature (Q) component of the QAM signal.

15. The system as recited in claim 13, wherein:

the first plurality of DAC circuits includes first, second, and third DAC circuits, wherein a clock signal received by the first DAC circuit is delayed relative to a clock signal received by the second DAC circuit, and wherein a clock signal received by the second DAC circuit is delayed relative to a clock signal received by the third DAC circuit; and the second plurality of DAC circuits includes fourth, fifth, and sixth DAC circuits, wherein a clock signal received by the fourth DAC circuit is delayed relative to a clock signal received by the fifth DAC circuit, and wherein a clock signal received by the fifth DAC circuit is delayed relative to a clock signal received by the sixth DAC circuit.

16. The system as recited in claim 13, further comprising a test signal generator configured to generate the first and second digital test signals.

17. The system as recited in claim 16, wherein the system includes a radio receiver integrated circuit (IC), wherein the test signal generator, the first and second correlators, and the first and second D/A conversion units are implemented on the radio receiver IC.

18. The system as recited in claim 13, further comprising a first low-pass filter coupled to receive the first analog signal and configured to provide a filtered version of the first analog signal to the first ADC circuit, and a second low-pass filter coupled to receive the second analog signal and configured to provide a filtered version of the second analog signal to the second ADC circuit.

* * * * *